(12) United States Patent
Chen et al.

(10) Patent No.: US 10,090,308 B1
(45) Date of Patent: Oct. 2, 2018

(54) SEMICONDUCTOR MEMORY DEVICE

(71) Applicant: UNITED MICROELECTRONICS CORP., Hsin-Chu (TW)

(72) Inventors: Chien-Hung Chen, Taipei (TW); Meng-Ping Chuang, Hsinchu (TW); Hsueh-Hao Shih, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 1 day.

(21) Appl. No.: 15/498,464

(22) Filed: Apr. 26, 2017

(30) Foreign Application Priority Data

Mar. 28, 2017 (TW) .............................. 106110285 A

(51) Int. Cl.
| | |
|---|---|
| *H01L 27/11* | (2006.01) |
| *H01L 27/02* | (2006.01) |
| *H01L 27/092* | (2006.01) |
| *H01L 23/528* | (2006.01) |
| *G11C 11/417* | (2006.01) |

(52) U.S. Cl.
CPC ........ *H01L 27/1104* (2013.01); *G11C 11/417* (2013.01); *H01L 23/528* (2013.01); *H01L 27/0207* (2013.01); *H01L 27/0928* (2013.01); *H01L 27/11* (2013.01)

(58) Field of Classification Search
CPC ............... H01L 27/1104; H01L 23/528; H01L 27/0207; H01L 27/0928; G11C 11/417
See application file for complete search history.

(56) References Cited

U.S. PATENT DOCUMENTS

| | | | |
|---|---|---|---|
| 7,612,417 B2 | 11/2009 | Osada | |
| 2003/0034571 A1* | 2/2003 | Nii | ........................ G11C 11/412 257/321 |
| 2004/0125676 A1* | 7/2004 | Osada | ................. G06F 11/1008 365/201 |
| 2005/0078546 A1* | 4/2005 | Hirano | .................... H01L 21/84 365/232 |
| 2011/0157965 A1* | 6/2011 | Nii | ....................... G11C 11/4125 365/156 |
| 2013/0026580 A1* | 1/2013 | Morimoto | ........... H01L 27/0207 257/369 |

* cited by examiner

*Primary Examiner* — A. Sefer
(74) *Attorney, Agent, or Firm* — Winston Hsu

(57) ABSTRACT

A semiconductor memory device having a memory cell including a plurality of memory cells, a first P-type well region, a second P-type well region, and an N-type well region disposed between the first P-Type well region and the second P-type well region. The semiconductor memory element defines a plurality of first regions, a plurality of second regions, a plurality of third regions, and a plurality of fourth regions, and each first region includes the memory cell. Each second region, each third region and each fourth region include a voltage contact to provide a voltage to the first P-type well region, the second P-type well region, and the N-type well region. The first region to the fourth region do not overlap with each other.

14 Claims, 5 Drawing Sheets

SEMICONDUCTOR MEMORY DEVICE

BACKGROUND OF THE INVENTION

1. Field of the Invention

The invention relates to a semiconductor memory device, and more particularly, to a semiconductor memory device with static random access memory (SRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The present invention provides a semiconductor memory device, the semiconductor memory device comprising a first P-type well region, extending along a first direction, a second P-type well region, extending along the first direction, and an N-type well region, extending along the first direction, and disposed between the first P-type well region and the second P-type well region.

With respect to a plan view of a principal plane of the semiconductor memory device, the following conditions are satisfied: (1) the semiconductor memory device defines a plurality of first regions, each first region being arranged along the first direction; (2) the semiconductor memory device defines at least one second region, at least one third region and at least one fourth region, each first region, the at least one second region, the at least one third region and the at least one fourth region not being overlapped with each other; (3) each second region further comprises a first voltage providing contact, directly contacting the N-type well region and providing a first voltage to the N-type well region, each third region further comprises a second voltage providing contact, directly contacting the first P-type well region and providing a second voltage to the first P-type well region, each fourth region further comprises a third voltage providing contact, directly contacting the second P-type well region and providing a third voltage to the second P-type well region; and (4) each first region comprises a memory cell disposed therein, the memory cells not being disposed within the at least one second region, the at least one third region and the at least one fourth region, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

In another embodiment of the present invention, with respect to a plan view of a principal plane of the semiconductor memory device, the following conditions are satisfied: (1) the semiconductor memory device defines a plurality of first regions, each first region being arranged along the first direction; (2) the semiconductor memory device defines at least one second region and at least one third region, each first region, the at least one second region and the at least one third region not being overlapped with each other; (3) each second region further comprises a first voltage providing contact, directly contacting the N-type well region and providing a first voltage to the N-type well region, each third region further comprises a second voltage providing contact, directly contacting the first P-type well region and providing a second voltage to the first P-type well region, and a local interconnect, directly contacting the second P-type well region and the first P-type well region and providing the second voltage to the second P-type well region; and (4) each first region comprises a memory cell disposed therein, the memory cells not being disposed within the at least one second region or the at least one third region, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
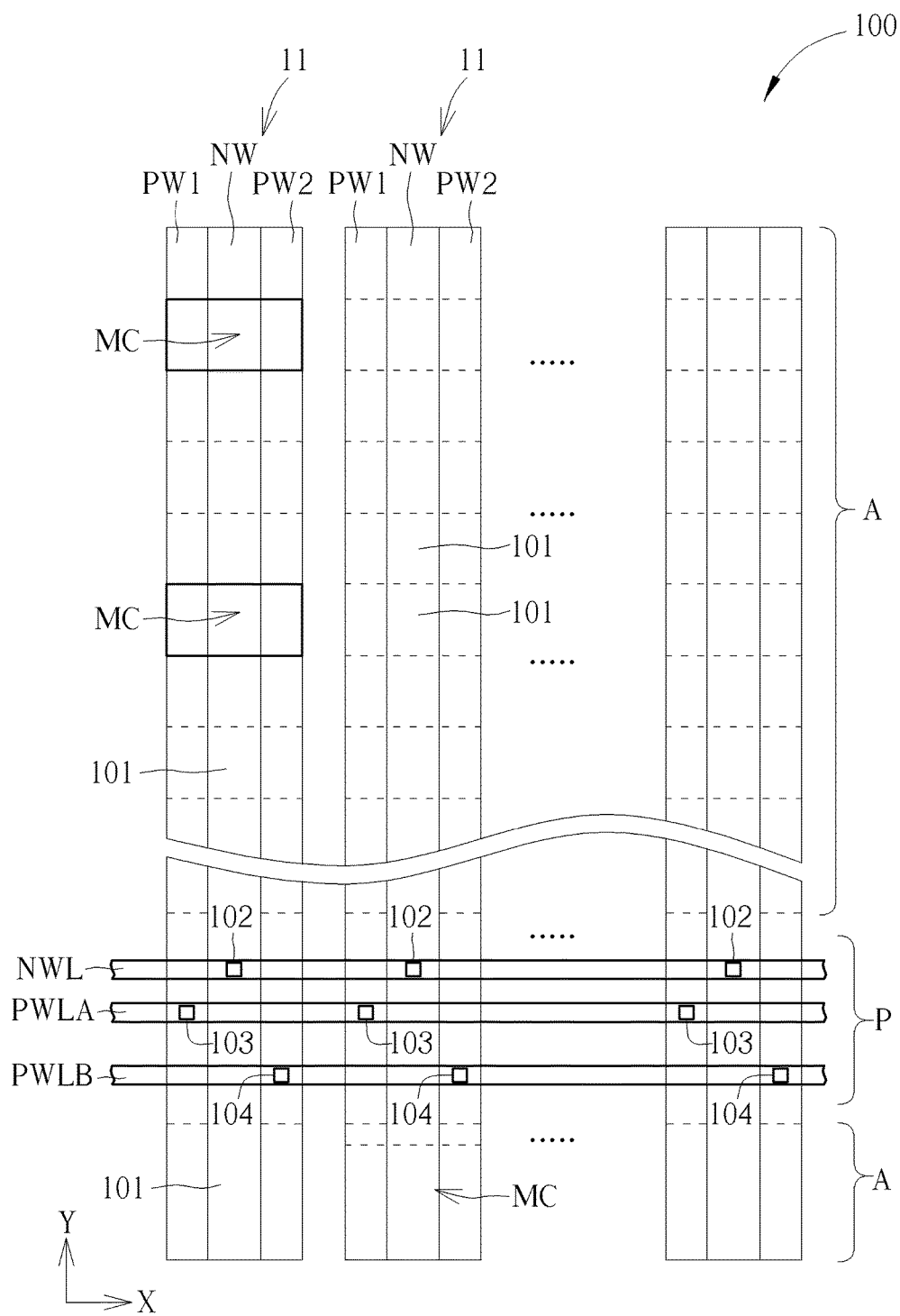
FIG. 1 illustrates a partial top view diagram of the semiconductor memory device according to a first preferred embodiment of the present invention.

Please refer to FIG. 1. FIG. 1 illustrates a partial top view diagram of the semiconductor memory device according to a first preferred embodiment of the present invention. As shown in FIG. 1, a semiconductor memory device 100 includes a plurality of memory arrays 11 parallel to each other, each memory array 11 including a plurality of memory cells MC (to simplify the figure, only parts of the memory cells MC are labeled in FIG. 1), and each memory cell MC being arranged along a first direction (such as Y-direction). The memory cell MC may be a static random access memory (SRAM), more precisely, a six-transistor static random access memory (6T-SRAM) or an eight-transistor static random access memory (8T-SRAM), but not limited thereto. In order to simplify the figure, the inner structure of each SRAM is omitted, and not shown in FIG. 1. The structure of the SRAM will be described in more detail in the following paragraphs.

In the substrate under each memory array, a first P-type well region PW1, a second P-type well region PW2 and an N-type well region NW are formed. The first P-type well region PW1, the second P-type well region PW2 and the N-type well region NW are arranged along the first direction, and the N-type well region NW is disposed between the first P-type well region PW1 and the second P-type well region PW2. In the present invention, each memory cell MC includes a plurality of N-channel MOS transistors (NMOS transistors) and a plurality of P-channel MOS transistors (PMOS transistors) (not shown in FIG. 1), each PMOS transistor being disposed within the N-type well region NW, each NMOS transistor being disposed within the first P-type well region PW1 or the second P-type well region PW2. When viewed in the top view, the first P-type well region PW1, the second P-type well regions PW2 and the N-type well region NW are long stripe-shaped and arranged along the first direction, so the manufacturing process can be simplified. Furthermore, all memory cells MC are also arranged along the first direction, so the memory cells MC of one memory array 11 share the first P-type well region PW1, the second P-type well region PW2, and the N-type well region NW, and the structure is simple.

When viewed in the top view, each memory array 11 of the semiconductor memory device 100 defines a plurality of first regions 101, a plurality of second regions 102, a plurality of third regions 103 and a plurality of fourth regions 104, the first regions 101, the second regions 102, where the third regions 103 and each of the fourth regions 104 are not overlapped with each other. Each first region 101 comprises one memory cell MC disposed therein, but each second region 102, each third region 103 and each fourth region 104 do not comprise the memory cell MC disposed therein. Each memory array 11 substantially includes two parts: the active region A and the periphery region P, the first regions 101 are adjacent to each other within the active region A, preferably, specific numbers of the first regions 101, such as 2$^n$ (n being an integer greater than 1) first region 101 compose a memory group, and each memory array 11 may include a plurality of memory groups (such as M memory groups, and each memory group has 2$^n$ first regions 101). The periphery region P is disposed between two memory groups, and the second region 102, the third regions 103 and the fourth regions 104 are disposed within the periphery region P. More precisely, 2$^n$ first region 101 totally includes 2$^n$ memory cells MC, each memory cell MC storing data respectively, and the second region 102, the third regions 103 and the fourth regions 104 being disposed between the memory groups (in the periphery region P).

Besides, a first voltage providing line NWL, one second voltage providing line PWLA and a third voltage providing line PWLB pass through the second region 102, the third region 103 and the fourth region 104 respectively, and are arranged along a second direction (such as X-direction). The first voltage providing lines NWL provide a first voltage to the N-type well region NW, the first voltage providing lines NWL provide a first voltage to the N-type well region NW, and make the N-type well region NW have a specific bias. Similarly, the second voltage providing lines PWLA provide a second voltage to the first P-type well region PW1, the third voltage providing line PWLB provides a third voltage to the second P-type well region PW2, and make the first P-type well region PW1 and the second P-type well region PW2 have a specific bias. The purpose for providing the bias is to adjust the threshold voltage (Vt) or to reduce the tunneling effect. In addition, the arrangement of the first voltage providing line NWL, the second voltage providing line PWLA and the third voltage providing line PWLB of the present invention is not limited to FIG. 1, and they can be adjusted according to actual requirements. But it is noteworthy that when viewed in the top view, the first voltage providing line NWL, the second voltage providing line PWLA and the third voltage providing line PWLB are not overlapped with each first region 101. Besides, in the present invention, the second voltage provided by the second voltage providing line PWLA and the third voltage provided by the third voltage providing line PWLB have different sources, but may be the same potential. In other embodiments, the second voltage provided by the second voltage providing line PWLA and the third voltage provided by the third voltage providing line PWLB have the same source.

Furthermore, other metal lines may pass through the second region 102, the third region 103 and the fourth region 104 such as the metal line for providing the voltage Vcc or Vss (or grounded line) to the memory cell MC, word lines or bit lines. To simplify the description, these metal lines are omitted, but it can be understood that the metal lines belong to the elements of the semiconductor memory device.

Figure 2:
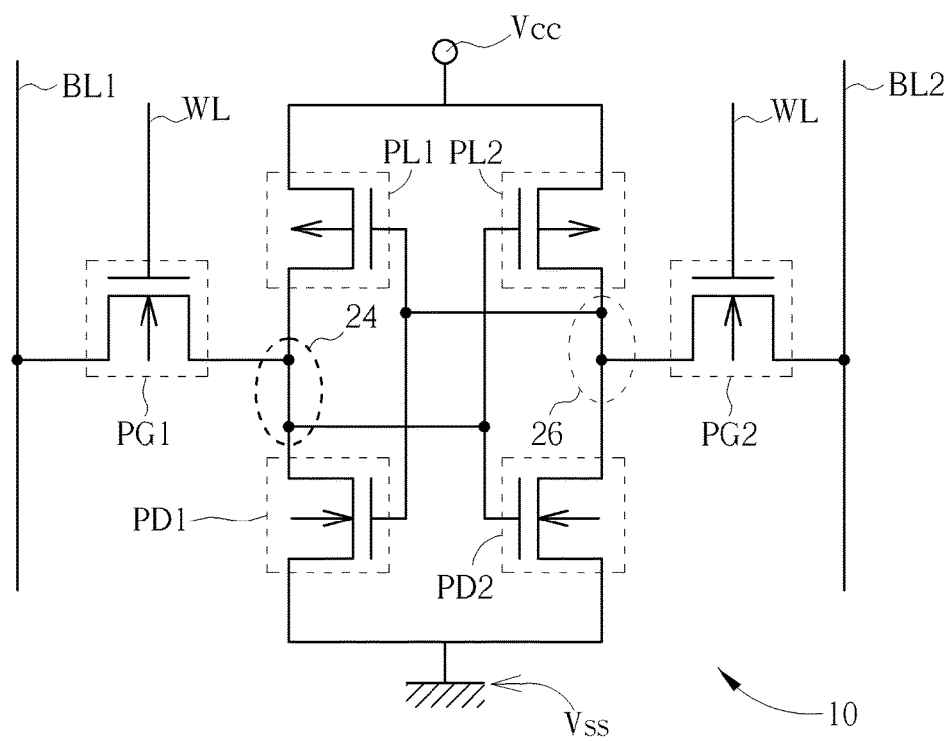
FIG. 2 illustrates a circuit diagram of a six-transistor SRAM (6T-SRAM) cell according to a first preferred embodiment of the present invention.

The memory cell MC of the present invention preferably comprises a six-transistor SRAM (6T-SRAM) 10. It is noteworthy that in other embodiments of the present invention, the memory cell MC is not limited to 6T-SRAM, it can also include such as 8T-SRAM or other suitable memory elements. The following paragraphs take the 6T-SRAM as an example. Please refer to FIG. 2. FIG. 2 illustrates a circuit diagram of a six-transistor SRAM (6T-SRAM) cell according to a first preferred embodiment of the present invention.

In this embodiment, each 6T-SRAM cell 10 is composed of a first pull-up device PL1, a second pull-up device PL2, and a first pull-down device PD1, a second pull-down device PD2, a first pass gate device PG1 and a second pass gate device PG2. These six devices (transistors) constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 6T-SRAM cell 10 are composed of p-type metal oxide semiconductor (PMOS) transistors; the first and the second pull-down devices PD1 and PD2, the first pass gate devices PG1 and the second pass gate devices PG2 are composed of n-type metal oxide semiconductor (NMOS) transistors, but not limited thereto. The first pull-up device PL1 and the first pull-down device PD1 constitute an inverter, which further form a series circuit 28. One end of the series circuit 28 is connected to a voltage source Vcc and the other end of the series circuit 28 is connected to a voltage source Vss. Similarly, the second pull-up device PL2 and the second pull-down device PD2 constitute another inverter and a series circuit 30. One end of the series circuit 30 is connected to the voltage source Vcc and the other end of the series circuit 30 is connected to the voltage source Vss. The two inverters are cross-coupled to each other to store data.

The storage node 24 is connected to the respective gates of the second pull-down device PD2 and the second pull-up device PL2. The storage node 24 is also connected to the drains of the first pull-down device PD1, the first pull-up device PL1 and the first pass gate device PG1. Similarly, the storage node 26 is connected to the respective gates of the first pull-down device PD1 and the first pull-up device PL1. The storage node 26 is also connected to the drains of the second pull-down device PD2, the second pull-up device PL2 and the second pass gate device PG2. The gates of the first pass gate device PG1 and the second pass gate device PG2 are respectively coupled to a word line (WL); the source of the first pass gate device PG1 and the second pass gate device PG2 are respectively coupled to a first bit line (BL1) and a second bit line (BL2).

Figure 3:
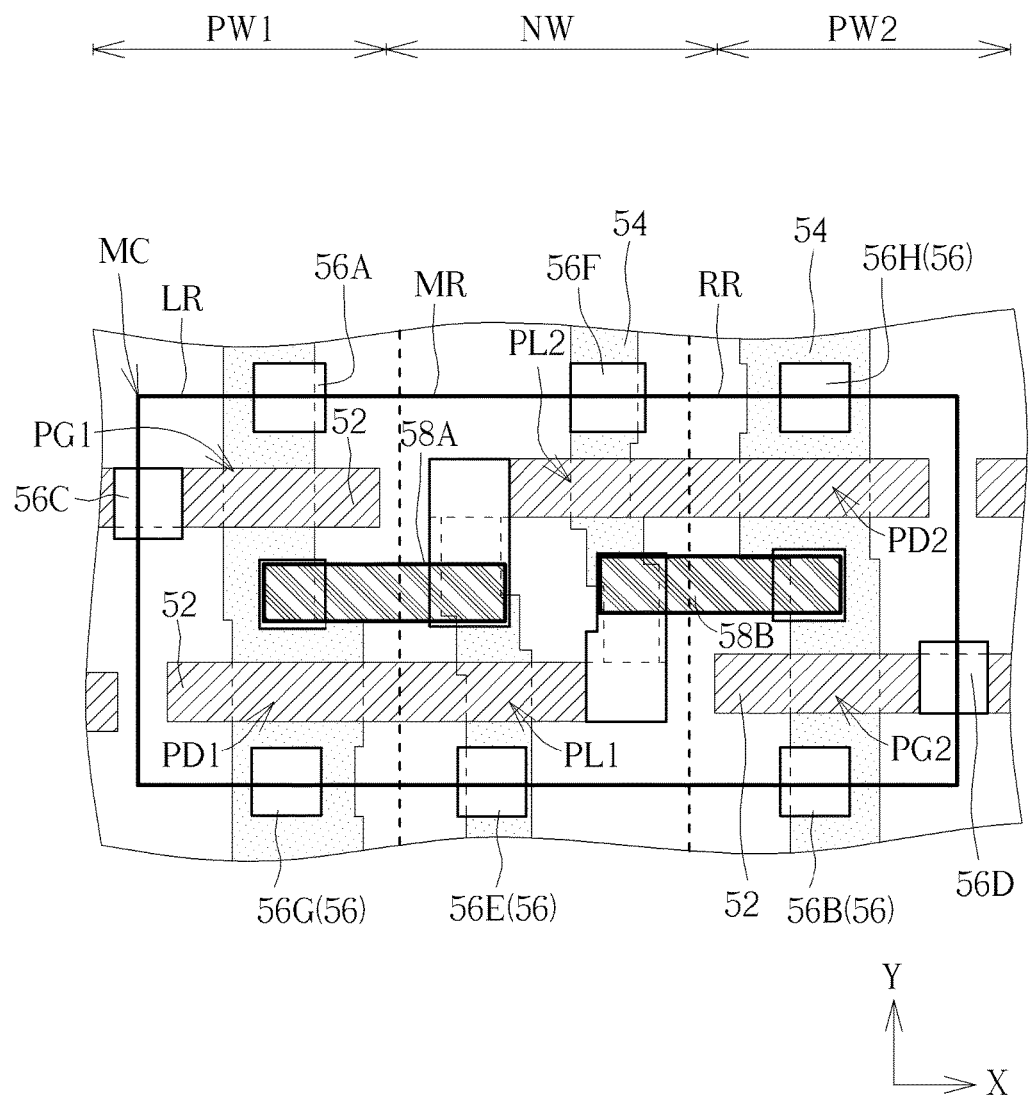
FIG. 3 illustrates a layout diagram of a memory cell (MC) within the first region 101 according to a first preferred embodiment of the present invention.

Please refer to FIG. 3, which illustrates a layout diagram of a memory cell (MC) within the first region 101 according to a first preferred embodiment of the present invention. As mentioned above, each first region 101, each second region 102 and each third region 103 have a memory cell MC disposed therein. Taking memory cell MC in the first region 101 as an example, the memory cells MC in the second region 102 or in the third region 103 have the similar structure to the memory cell MC mentioned here. The memory cell MC has a plurality of gate lines 52 and a plurality of diffusion regions 54 crossed to each other, the extending direction of the gate line 52 is substantially perpendicular to the extending direction of each diffusion region 54. The crossed portion of the gate lines 52 and each diffusion region 54 compose a plurality of transistors (i.e. the first pull-up transistor PL1, the second pull-up transistor PL2, the first pull-down transistor PD1, the second pull-down transistor PD2, the first access transistor PG1, and the second access transistor PG2 mentioned in FIG. 2, and labeled in FIG. 3).

It is noteworthy that in the region of one memory cell MC, a left region LR, a right region RR and a middle region MR are defined, the middle region MR is disposed between the left region LR and the right region RR. The left region LR overlaps with the first P-type well region PW1, the right region RR overlaps with the second P-type well region PW2, and the middle region MR overlaps with the N-type well region NW. All PMOS transistors of the memory cell MC (including the first pull-up transistor PL1, the second pull-up transistor PL2) are disposed within the middle region MR, and all NMOS transistors (including the first pull-down transistor PD1, the second pull-down transistor PD2, the first access transistor PG1, and the second access transistor PG2) of the memory cell MC are disposed within the left region LR or the right region RR.

Besides, the memory cell MC further comprises a plurality of contact structures 56, including contact structures 56A, 56B, 56C, 56D, 56E, 56F, 56G, and 56H, used to electrically connect different elements. For example, the contact structure 56A is electrically connected to the first access transistor PG1 and the first bit line BL1; the contact structure 56B is electrically connected to the second access transistor PG2 and the second bit line BL2; the contact structure 56C is electrically connected to one of the word line WL and the gate of the first access transistor PG1; the contact structure 56D is electrically connected to one of the word line and the gate of the second access transistor PG2; the contact structure 56E is electrically connected to the first pull-up transistor PL1 and the voltage source Vcc; the contact structure 56F is electrically connected to the second pull-up transistor PL2 and the voltage source Vcc; the contact structure 56G is electrically connected to the first pull-down transistor PD1 and the voltage source Vss (or grounded); the contact structure 56H is electrically connected to the first pull-down transistor PD1 and the voltage source Vss (or grounded), other contact structures not mentioned here are labeled as contact structures 56.

In addition, the SRAM further comprises a first metal layer 58A and a first metal layer 58B. The first metal layer 58A corresponds to the storage node 24 shown in FIG. 2, which is electrically connected to the gate of the second pull-down transistor PD2 and the gate of the second pull-up transistor PL2, and the drain of the first pull-down transistor PD1, the drain of the first pull-up transistor PL1 and the drain of the first access transistor PG1. On the other hand, the first metal layer 58B corresponds to the storage node 26 shown in FIG. 2, which is electrically connected to the gate of the first pull-down transistor PD1 and the gate of the first pull-up transistor PL1, and the drain of the second pull-down transistor PD2, the drain of the second pull-up transistor PL2 and the drain of the second access transistor PG2.

Figure 4:
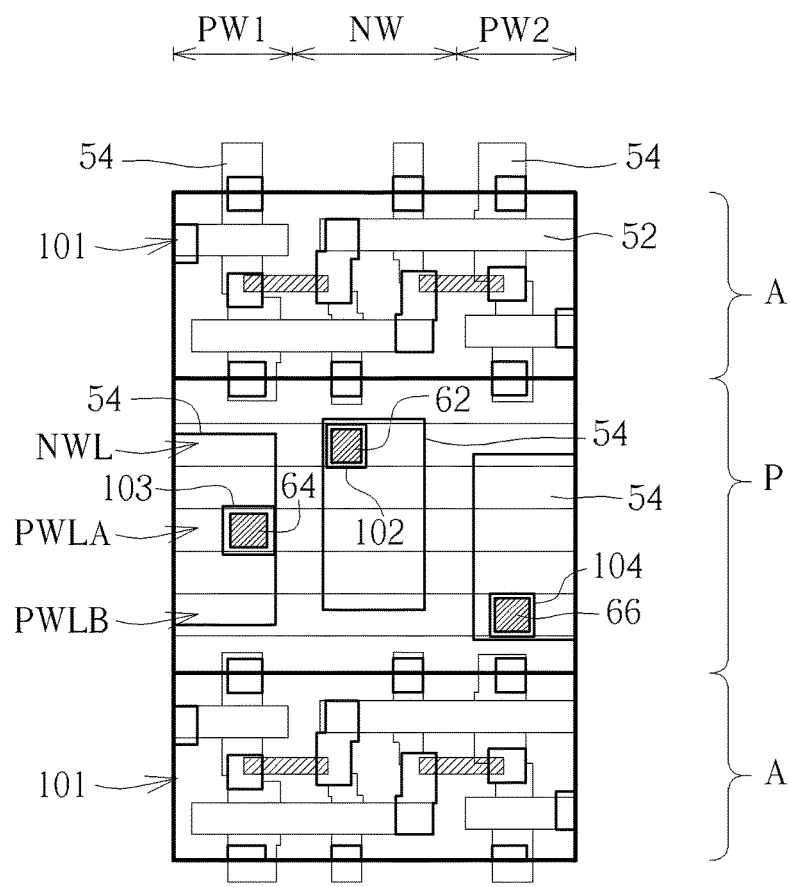
FIG. 4 illustrates the layout diagrams of partial first region, partial second region, partial third region and partial fourth region of the present invention according to the first preferred embodiment of the present invention.

Next, please refer to FIG. 4, which illustrates the schematic diagram of a partial first region 101, a partial second region 102, a partial third region 103 and a partial third region 104 of the present invention. It should be noted that in FIG. 4, only the gate lines 52, the diffusion regions 54 and the contact structures 56 are shown, and other elements such as the first metal layer are temporarily omitted. Besides, the second region 102, the third region 103 and the fourth region 104 within the periphery region P do not comprise the memory cell MC (such as 6T-SRAM) disposed therein, and the diffusion regions 54 in the periphery region P do not contact the diffusion regions 54 in the active region A.

The second region 102 further comprises a first voltage providing contact 62, directly contacting the N-type well region NW, and electrically connected to the first voltage providing line NWL, so as to provide the first voltage to the N-type well region NW through the first voltage providing line NWL. Similarly, the third region 103 further comprises a second voltage providing contact 64, directly contacting the first P-type well region PW1, and electrically connected to the second voltage providing line PWLA, so as to provide the second voltage to the first P-type well region PW1 through the second voltage providing line PWLA, the fourth region 104 further comprises a third voltage providing contact 66, directly contacting the second P-type well region PW2, and electrically connected to the third voltage providing line PWLB, so as to provide the third voltage to the second P-type well region PW2 through the third voltage providing line PWLB.

It is noteworthy that there are not any contact structures used for providing the first voltage to the N-type well region NW within the first region 101, or any contact structures used for providing the second voltage and the third voltage to the first P-type well region PW1 and the second P-type well region PW2 disposed within the first region 101. In other words, all needed voltages of the N-type well region NW, the first P-type well region PW1 and the second P-type well region PW2 in the first region 101, are provided by the first voltage providing line NWL, the second voltage providing line PWLA, and the third voltage providing line PWLB. Therefore, since the first voltage providing line NWL, the second voltage providing line PWLA, and the third voltage providing line PWLB are not disposed in the first region 101, the area of each first region 101 can be decreased.

Figure 5:
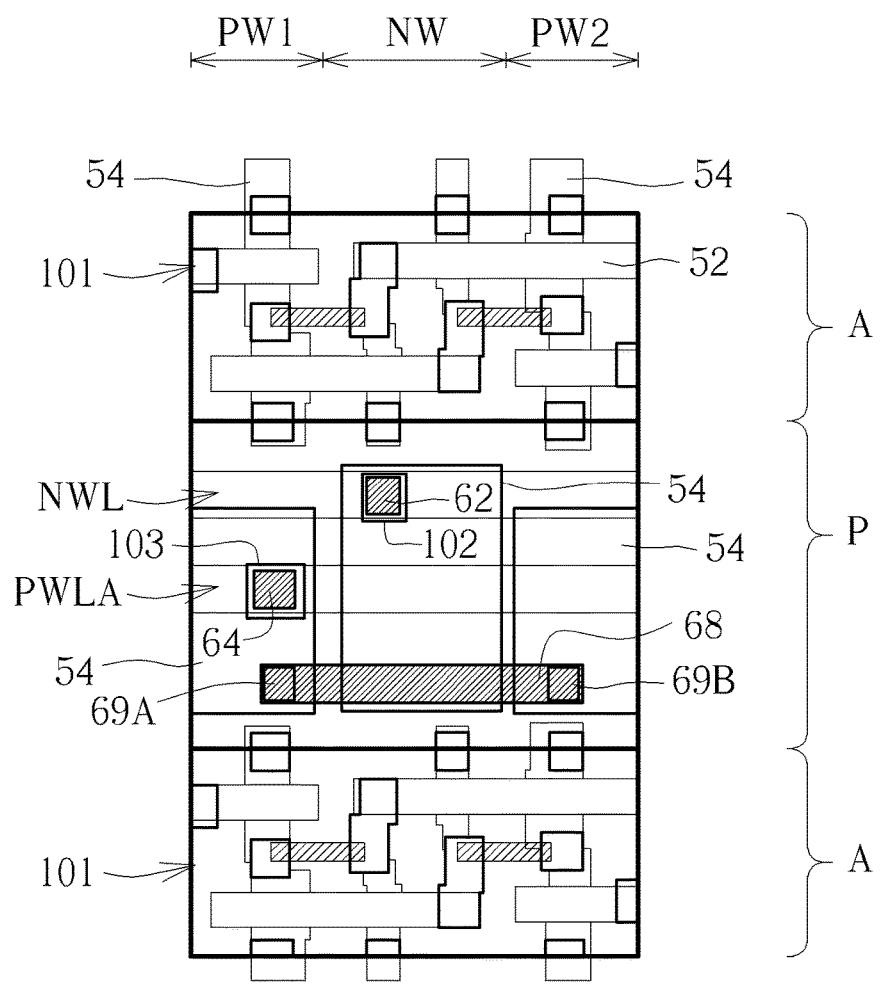
FIG. 5 illustrates the layout diagrams of partial first region, partial second region, partial third region and partial fourth region of the present invention according to another preferred embodiment of the present invention.

In addition, please refer to FIG. 5, which illustrates the schematic diagram of the partial first region 101, the partial second region 102 and the partial third region 103 according to another embodiment of the present invention. As shown in FIG. 5, most structures in this embodiment are same as that in the first preferred embodiment mentioned above, and the same parts will not be described again. The differences between this embodiment and the first preferred embodiment is that this embodiment does not comprise the third voltage providing line PWLB used for providing the third voltage, but only comprises the first voltage providing line NWL and the second voltage providing line PWLA. The first voltage providing line NWL passes through the second region 102, electrically connected to the N-type well region NW through the first voltage providing contact 62; the second voltage providing line PWLA passes through the third region 103, electrically connected to the first P-type well region PW1 through the second voltage providing contact 64. In addition, the embodiment further comprises a local interconnect 68, electrically connected to a contact structure 69A and a contact structure 69B, which is used for electrically connecting the first P-type well region PW1 within the third region 103 and the second P-type well region PW2, but the local interconnect 68 does not contact the second voltage providing line PWLA directly. Therefore, in this embodiment, both the needed voltage of the first P-type well region PW1 and the second P-type well region PW2 are provided by the second voltage providing line PWLA.

A key feature of the present invention is having long stripe-shaped P-type well regions and N-type well regions, and all memory cells are disposed within and arranged along the P-type well regions or the N-type well regions, which allows the manufacturing processes to be simplified. In addition, each memory cell in the first region responsible for the main data storage function, and the needed voltages contacts of the memory cells (including the Vcc, Vss, or the voltages providing to the P-type well regions and N-type well regions) are not disposed within the first region, but only disposed within the second region, the third region or the fourth region, so the area of each first region can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
   a first P-type well region, extending along a first direction;
   a second P-type well region, extending along the first direction;
   an N-type well region, extending along the first direction, and disposed between the first P-type well region and the second P-type well region;
   wherein with respect to a plan view of a principal plane of the semiconductor memory device, the following conditions are satisfied:
   (1) the semiconductor memory device defines a plurality of first regions, each first region being arranged along the first direction;
   (2) the semiconductor memory device defines at least one second region, at least one third region and at least one fourth region, each of the first region, the at least one second region, the at least one third region and the at least one fourth region not being overlapped with each other;
   (3) each of the at least one second region further comprises a first voltage providing contact, directly contacting the N-type well region and providing a first voltage to the N-type well region, each of the at least one third region further comprises a second voltage providing contact, directly contacting the first P-type well region and providing a second voltage to the first P-type well region, each of the at least one fourth region further comprises a third voltage providing contact, directly contacting the second P-type well region and providing a third voltage to the second P-type well region; and
   (4) each of the first region comprises a memory cell disposed therein, the memory cells not being disposed within the at least one second region, the at least one third region and the at least one fourth region, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

2. The semiconductor memory device of claim 1, further comprising:
   a first bit line, a second bit line and a plurality of word lines, each memory cell having a first inverter including a first NMOS transistor and a first PMOS transistor;
   a second inverter including a second NMOS transistor and a second PMOS transistor, the first inverter and the second inverter being coupled to each other;
   a third NMOS transistor having a source and a drain, coupled to an output terminal of the first inverter and the first bit line respectively; and
   a fourth NMOS transistor having a source and a drain, coupled to an output terminal of said second inverter and the second bit line respectively, wherein a gate of the third NMOS and a gate of the fourth NMOS are connected to one of the plurality of word lines.

3. The semiconductor memory device of claim 2, wherein the first PMOS transistor and the second PMOS transistor of each memory cell are disposed within the N-type well region, the first NMOS transistor and the third NMOS transistor of each memory cell are disposed within the first P-type well region, and the second NMOS transistor and the fourth NMOS transistor of each memory cell are disposed within the second P-type well region.

4. The semiconductor memory device of claim 2, wherein the first region further comprising:
   a first contact structure, electrically connected to the third NMOS transistor and the first bit line;
   a second contact structure, electrically connected to the fourth NMOS transistor and the second bit line;
   a third contact structure, electrically connected to one of the plurality word lines and the gate of the third NMOS transistor; and a fourth contact structure, electrically connected to one of the plurality word lines and the gate of the fourth NMOS transistor.

5. The semiconductor memory device of claim 1, wherein the first region does not comprise any contact structure used for providing the first voltage to the N-type well region.

6. The semiconductor memory device of claim 1, wherein the first region does not comprise any contact structure used for providing the second voltage to the first P-type well region.

7. The semiconductor memory device of claim 1, wherein the first region does not comprise any contact structure used for providing the third voltage to the first P-type well region.

8. The semiconductor memory device of claim 1, wherein the second voltage and the third voltage have different sources.

9. The semiconductor memory device of claim 1, wherein the second voltage and the third voltage have the same source.

10. The semiconductor memory device of claim 1, further comprising a plurality of memory arrays, each memory array comprises the plurality of said memory cells arranged along the first direction.

11. The semiconductor memory device of claim 10, wherein each memory array comprises:
M first memory groups, each first memory group comprising N first regions, wherein N=$2^n$, n being an integer greater than 1; and
the at least one second region, the at least one third region and the at least one fourth region being disposed between two adjacent first regions.

12. A semiconductor memory device, comprising:
a first P-type well region, extending along a first direction;
a second P-type well region, extending along the first direction;
an N-type well region, extending along the first direction, and disposed between the first P-type well region and the second P-type well region;
wherein with respect to a plan view of a principal plane of the semiconductor memory device, the following conditions are satisfied:

(1) the semiconductor memory device defines a plurality of first regions, each first region being arranged along the first direction;

(2) the semiconductor memory device defines at least one second region and at least one third region, each of the first region, the at least one second region and the at least one third region not being overlapped with each other;

(3) each of the at least one second region further comprises a first voltage providing contact, directly contacting the N-type well region and providing a first voltage to the N-type well region, each of the at least one third region further comprises a second voltage providing contact, directly contacting the first P-type well region and providing a second voltage to the first P-type well region, and a local interconnect, directly contacting the second P-type well region and the first P-type well region and providing the second voltage to the second P-type well region; and (4) each of the first region comprises a memory cell disposed therein, the memory cells not being disposed within the at least one second region or the at least one third region, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

13. The semiconductor memory device of claim 12, wherein the first region does not comprise any contact structure used for providing the second voltage to the second P-type well region.

14. The semiconductor memory device of claim 12, wherein the second voltage providing contact is electrically connected to a voltage providing line, and the local interconnect does not directly contact the voltage providing line.

* * * * *